(12) United States Patent
Tsapepas et al.

(10) Patent No.: US 7,676,776 B2
(45) Date of Patent: Mar. 9, 2010

(54) SPARE GATE ARRAY CELL DISTRIBUTION ANALYSIS

(75) Inventors: Giorgos Stellos Tsapepas, Poughkeepsie, NY (US); David A. Webber, Poughkeepsie, NY (US); Michael Hemsley Wood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 11/767,542

(22) Filed: Jun. 25, 2007

(65) Prior Publication Data

US 2008/0320430 A1 Dec. 25, 2008

(51) Int. Cl.
G06F 17/50 (2006.01)
(52) U.S. Cl. ............................................. 716/4; 716/17
(58) Field of Classification Search ........................ None
See application file for complete search history.

(56) References Cited

U.S. PATENT DOCUMENTS

| | | | |
|---|---|---|---|
| 5,355,337 A | 10/1994 | Kim | |
| 5,870,313 A * | 2/1999 | Boyle et al. | 716/10 |
| 5,963,489 A | 10/1999 | Kirihata | |
| 6,154,855 A | 11/2000 | Norman | |
| 6,205,063 B1 | 3/2001 | Aipperspach | |
| 6,480,501 B1 | 11/2002 | Blanc | |
| 6,563,749 B2 | 5/2003 | Ferrant | |
| 6,868,008 B2 | 3/2005 | Kamel | |
| 7,353,472 B2 * | 4/2008 | DeMaris et al. | 716/4 |
| 7,444,609 B2 * | 10/2008 | Charlebois et al. | 716/10 |

\* cited by examiner

*Primary Examiner*—Leigh Marie Garbowski
(74) *Attorney, Agent, or Firm*—William A. Kinneman, Jr.

(57) ABSTRACT

A method for determining gate array distribution includes steps or acts of: randomly placing a plurality of test boxes in a logic circuit layout; counting the number of fill cells in each of the plurality of test boxes; recording the count; grouping the plurality of test boxes into two groups: a first group with local clock buffers and a second group without local clock buffers; determining the fill cell percentage of each of the plurality of test boxes; and flagging the test boxes with a poor distribution of gate array cells.

12 Claims, 2 Drawing Sheets

Criteria:

| With LCB | Without LCB |
|---|---|
| # of samples < 10<br>Ratio > 2<br><br>-OR-<br><br># of samples > 10<br>Ratio > 1.2 | # of samples < 10<br>Ratio > 1<br><br>-OR-<br><br># of samples > 10<br>Ratio > 0.85 |

*FIG. 2*

SPARE GATE ARRAY CELL DISTRIBUTION ANALYSIS

CROSS-REFERENCE TO RELATED APPLICATIONS

None.

TRADEMARKS

IBM ® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention automates the process of determining the distribution of spare gate array cells in random logic macros (RLM) in the design of central processors.

2. Description of Background

The design of today's high speed microprocessor must be logically well-defined. The increased design complexity of leading-edge microprocessors and systems on a chip (SoC) is driving the industry to find better ways to implement the physical and logical designs of chips. The logical design involves gate array cells which can be used as spare logic for physical fixes requiring only higher level changes in the several layers of the chip. Having enough gate arrays in a design may determine if a bug fix is possible in a certain derivation of the design. For this reason it becomes important to maximize the density and efficiency of the placement (utilization) of the cells.

The process of analyzing the distribution of gate array cells is currently done by visual inspection of each macro individually. First a utilization code provides the design team with a fill cell percentage in a random logic macro (RLM). An RLM is a physical entity that includes control logic. It is desirable to know the percentage of the cells in the RLMs in order to determine the congestion by means of optimization criteria. Then the design team visually inspects the RLMs that are flagged as having poor utilization, as determined by the fill cell percentages. The problem with this method is that low utilization does not always equate with an unacceptable distribution of fill cells. Likewise, high utilization does not always equate to an acceptable distribution of fill cells.

SUMMARY OF THE INVENTION

The shortcomings of the prior art are overcome and additional advantages are provided through the provision of a method for determining gate array distribution using random sampling of the area within the random logic macro (RLM).

Briefly, we describe a method for determining gate array distribution, the method including steps or acts of: randomly placing a plurality of test boxes in a logic circuit layout; counting the number of fill cells in each of the plurality of test boxes; recording the count; grouping the plurality of test boxes into two groups: a first group with local clock buffers, a second group without local clock buffers; determining a fill cell percentage of each of the plurality of test boxes; and flagging the test boxes with a poor distribution of gate array cells. The test boxes have a dimension of 25µ by 25µ.

Further, the method includes steps of measuring the gate array layout to derive a layout size and then using that measurement, determine how many test boxes to place in the gate array layout. The test box dimensions may be varied based on designer input. The above method steps may be automated.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which drastically decreases the time it takes to complete a check in distribution criteria which is to analyze and approve of the distribution of gate array cells in random logic macros.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 2 illustrates one example of criteria used to flag poor distributions, according to an embodiment of the present invention.

Figure 1:
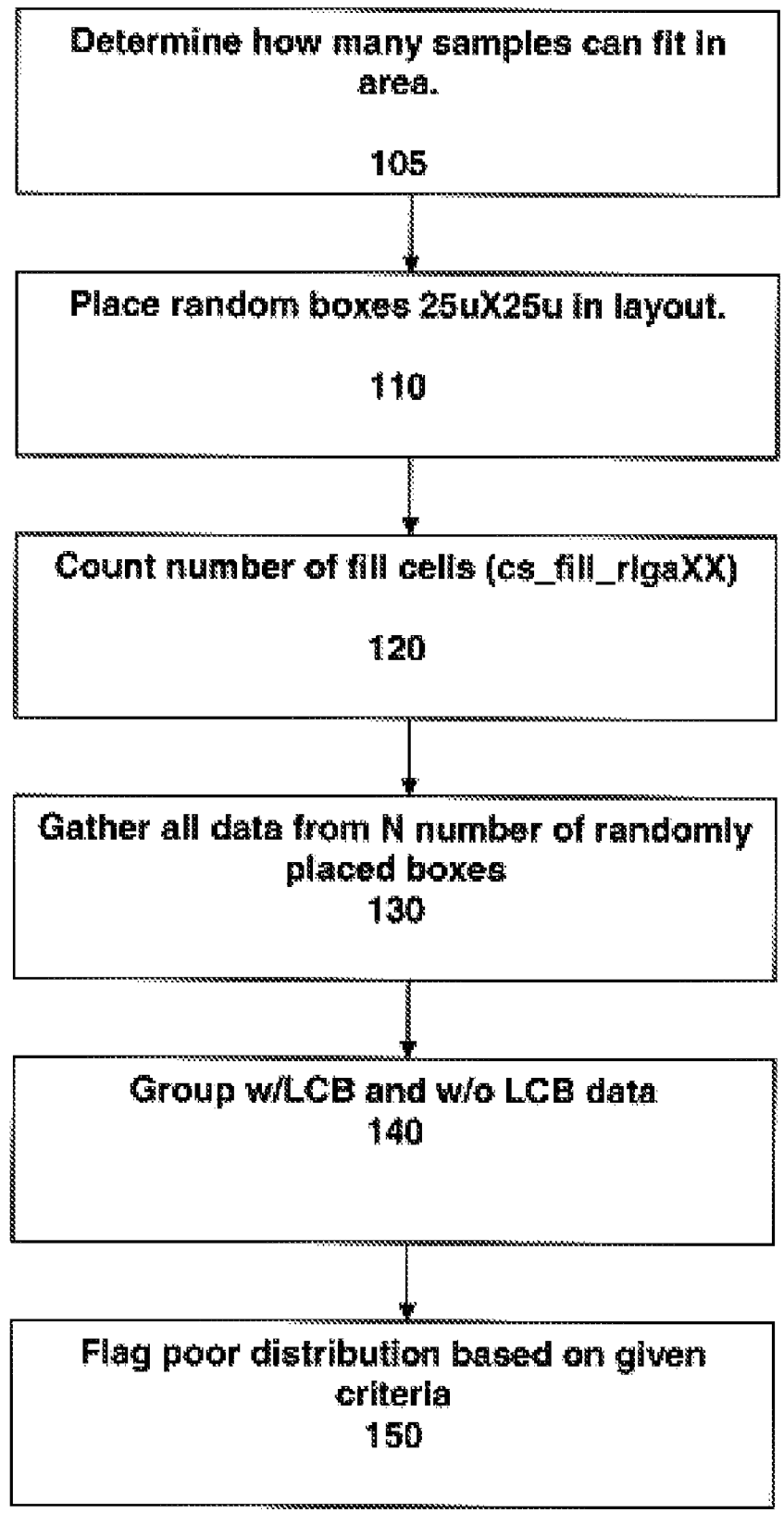
FIG. 1 is flow chart of the process steps for verifying the distribution of cells in a layout, according to an embodiment of the present invention.

The detailed description explains the preferred embodiments of the invention, together with advantages and features, by way of example with reference to the drawings.

DETAILED DESCRIPTION OF THE INVENTION

We describe a methodology for verifying the distribution of cells in a layout for central processor design using program code. By automating this process we shorten the production time and increase accuracy. The method involves analyzing the distribution of spare gate array cells in the design of central processors. In particular we focus our analysis on redundancy in logic macros.

Turning now to the drawings in greater detail, it will be seen that in FIG. 1 there is a flow chart of the process steps according to an embodiment of the present invention. First in step 105 we calculate how many sample test boxes to place. Generally this is done by first measuring the layout size. Next in step 110, boxes configured to the dimensions of 25µ×25µ are placed randomly in a layout, also known as the "floor plan." It should be understood that the "box" is not a physical box, but a virtual box and further, the dimensions of the box are for exemplary purposes only and the invention should not be construed as limited to any one measurement.

Next in step 120, we count the number of fill cells in the box (cs_fill_rlgaXX). The pseudo code below shows one embodiment of how this step may be performed.

Pseudo-code of gaStatistics
Find size of macro
Use size of macro to calculate number of samples to place
Number of samples that fit in macro times "i" variable
For (x=0 ->x =number of samples to place)
Randomly place a sample box inside macro
Count number of gate array cells in sample
Separate bin samples: with and without clock blocks Calculate the following statistics for the samples taken in loop above:
- Minimum number of gate array cells in one sample
- Mean number of gate array cells in all samples
- Root Mean Square of gate array cells in all samples
- Standard Deviation
- Ratio=Standard Deviation/Mean
- Total samples taken
- Total samples used in calculating statistics above
- Use pre-defined criteria to determine if macro meets fill cell distribution requirements In step 130 we proceed to gather all data from N number of randomly placed boxes. In step 140 we group the boxes with local clock buffer (LCB) data and without LCB data, then in step 150 we flag the poor distributions based on the given criteria. The given criteria are shown in FIG. 2. It is a benefit of this methodology that a user need only examine the flagged distributions.

Further benefits of this methodology are that code can be run on entire Core in a short amount of time; it can be incorporated in Audit Methodology; and automation provides Time and Accuracy.

The flow diagrams depicted herein are just examples. There may be many variations to these diagrams or the steps (or operations) described therein without departing from the spirit of the invention. For instance, the steps may be performed in a different order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for determining gate array distribution, the method comprising steps of:
    using a logic macro to perform analysis of spare gate array cells, using a computer, wherein a logic macro is a physical entity including control logic, wherein the analysis comprises:
    randomly placing a plurality of virtual test boxes in a logic circuit layout;
    counting the number of gate array cells in each of the plurality of virtual test boxes;
    recording the count and its location in a storage device;
    grouping the plurality of virtual test boxes into two groups: a first group with local clock buffers, and a second group without local clock buffers;
    determining a gate array cell percentage of each of the plurality of virtual test boxes, wherein said gate array cell percentage comprises a density of the gate array cells in the virtual test box;
    comparing the determined gate array cell percentage with pre-determined criteria for distribution of gate array cells; and
    flagging the test boxes with a poor distribution of gate array cells.

2. The method of claim 1 wherein the step of randomly placing a plurality of test boxes comprises a step of:
    placing test boxes with dimensions of 25μ by 25μ.

3. The method of claim 1 further comprising steps of:
    measuring the gate array layout to derive a layout size; and
    determining how many test boxes to place in the gate array layout using the layout size.

4. The method of claim 3 further comprising a step of:
    varying the test box dimensions based on designer input.

5. The method of claim 1 wherein the criteria for the first group differ from the criteria for the second group.

6. The method of claim 1 further comprising a step of:
    calculating statistics for the plurality of test boxes.

7. The method of claim 1 wherein the fill cell distribution requirements are automatically generated.

8. The method of claim 7 wherein the method steps are automated.

9. The method of claim 1 further comprising a step of:
    using the determined gate array distribution in constructing a gate array if the gate array layout meets the fill cell distribution requirements.

10. The method of claim 1 further comprising a step of:
    varying the placement of the test boxes if the gate array layout does not meet the fill cell distribution requirements.

11. The method of claim 1 further comprising a step of:
    varying the dimensions of the test boxes if the gate array layout does not meet the fill cell distribution requirements.

12. The method of claim 1 wherein the number of fill cells are counted with a cs_fill_rlga function.

* * * * *